United States Patent [19]

Basarath et al.

[11] Patent Number: 4,536,715
[45] Date of Patent: Aug. 20, 1985

[54] LINEAR DUAL DETECTOR OPTO-ISOLATOR CIRCUIT

[75] Inventors: Brian A. Basarath, Parsippany; Robert J. Kakalec, Madison, both of N.J.

[73] Assignee: AT&T Bell Laboratories, Murray Hill, N.J.

[21] Appl. No.: 558,286

[22] Filed: Dec. 5, 1983

[51] Int. Cl.³ .............................................. H03F 17/00
[52] U.S. Cl. ......................................... 330/2; 330/59; 330/308
[58] Field of Search ............................. 330/2, 59, 308; 307/311; 250/214 A, 214 C

[56] References Cited

U.S. PATENT DOCUMENTS 4,190,747  2/1980  Feiner ................................ 179/170

OTHER PUBLICATIONS

Olschewski, "Optical Coupling Extends Isolation-Amplifier Utility", *Electronics*, Aug. 19, 1976, vol. 49, No. 17, pp. 81–88, 330–359.

*Primary Examiner*—James B. Mullins
*Attorney, Agent, or Firm*—Alfred G. Steinmetz

[57] ABSTRACT

A signal coupling arrangement including a dual detector opto-isolator arrangement operative to transfer a sensed DC signal from an input to an output of an amplifying circuit with an isolated electrical system there between incorporates amplifiers having a specific gain set by unique calibration means and to initially preset the coupling circuitry amplification gains to assure a consistent DC current transfer and DC contrast ratio in coupling DC signals from the input to the output.

8 Claims, 1 Drawing Figure

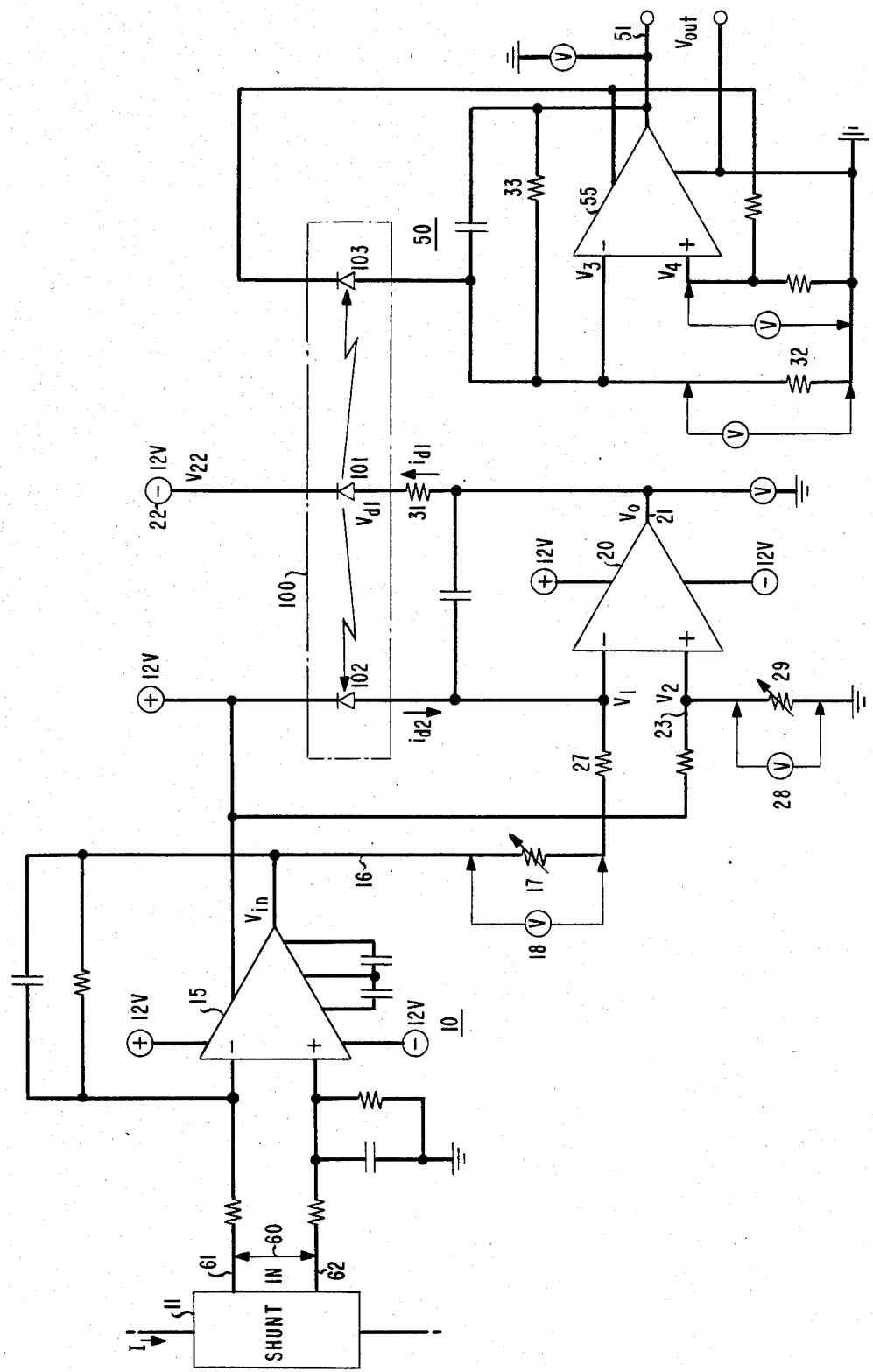

1

LINEAR DUAL DETECTOR OPTO-ISOLATOR CIRCUIT

TECHNICAL FIELD

This invention relates to opto-isolation of electrical ground and more particularly to an amplifier having specific gain characteristics for compensating for different current transfer ratios of a dual detector opto-isolator, when high accuracy is required.

BACKGROUND OF THE INVENTION

Opto-isolators are frequently used as replacements for transformers in providing DC ground isolation in power circuits. Their low cost, low weight and ability to be enbodied in integrated circuit form are particularly advantageous in small board mounted circuits. A dual detector opto-isolator containing one light emitting device and two light detecting devices is often used when a negative feedback signal is needed to linearize the light emitting diode current-voltage characteristic independently of temperature. Since the light emitting device supplies the basic source emission for both the output and feedback signal, no additional feedback circuitry coupled to the output signal is necessary.

A problem encountered in such an application of this device is related to the fact that the transfer gain from the light emitting device to each of the light detecting devices differs from each other and from one opto-isolator to another. Hence in an amplification application requiring ground isolation between inputs and output, the variability of the current gains in both forward current and feedback current will affect operation of individual amplifier units and cause them to be different from one another. This is particularly true in situations requiring DC signal transmission. Prior arrangements concerned with the opto-isolator variability such as disclosed in U.S. Pat. No. 4,190,747 issued to A. Feiner et al have been concerned with controlling linearity of an AC signal transfer through a dual detector opto-isolator. Arrangements for properly utilizing a dual detector opto-isolator in high accuracy transmission of DC signals have not been priorly disclosed.

Opto-isolator arrangements having one emitting device and two detecting devices which are utilized to transmit DC signals must account for both DC contrast and the current transfer ratio. The current transfer ratio represents the ratio of the DC current from emitting device to the detector device and the DC contrast is the ratio of the current transfer ratios of the two detecting diodes.

These factors must be controllable and fully accounted for in any power circuit utilizing a power amplifier circuit to transmit sensed DC voltages across a ground isolation circuit including a dual detector opto-isolator to isolate the electrical ground of input and output.

SUMMARY OF THE INVENTION

Therefore a signal coupling arrangement including a dual detector opto-isolator arrangement operative to transfer a sensed DC signal from an input to an output of an amplifying circuit with an isolated electrical ground there between incorporates specific amplification gain values preset by calibration procedures to control the coupling circuitry amplification gains to assure a linear relationship between the sensed shunt current and output voltages regardless of the differences in DC current transfer and contrast ratios. This particular amplification gain value compensates for both current transfer and contrast ratios within the opto-isolator unit.

In particular, an input amplifier circuit is utilized to sense a low level voltage representative of a current signal and transmit the amplified sensed voltage through a dual detector opto-isolator to an output amplifier circuit. The input and output amplifying circuits have sufficient gain to compensate for signal loss in the opto-isolator and are also calibrated in accord with the principles of the invention to adjust amplification gain in order to secure consistent control of the contrast and transfer ratio of the amplifing system so that a consistent signal transfer from one unit to another is assured. The calibration technique to set the amplification gain comprises a series of steps in which a series of voltages are adjusted to establish controlled amplifier gains with a preset calibration procedure.

BRIEF DESCRIPTION OF THE DRAWING

An understanding of the invention may be readily attained by reference to the following specification and the accompanying drawing in which the sole FIGURE is a schematic of a DC signal coupling arrangement utilizing a dual detector opto-isolator to secure electrical ground isolation from input to output.

DETAILED DESCRIPTION

A sensing circuit 10 shown in the FIGURE is used to sense a current in a current shunt 11 and to transmit a signal representative of that current via a sending amplifier 20 to a receiving amplifier circuit 50 which is electrically ground isolated from the sensing circuitry 10.

The circuit shunt 11 is connected into a circuit path carrying a power current that is to be monitored. Shunt 11 is known impedance, preferably of very low resistance, and hence provides a very low millivolt signal proportioned to the current being sensed. The voltage across the shunt 11 is filtered and then amplified by operational amplifier 15 to produce a representative DC voltage signal on lead 16. This DC voltage signal is coupled via variable resistor or potentiometer 17 to the inverting input of operational amplifier 20 which produces an amplified DC output proportional to the DC shunt current. The output circuit of operational amplifier 20 is coupled through a light emitting diode 101 to a voltage source at terminal 22.

Light emitting diode 101 is part of a dual detector opto-isolator 100. Opto-isolator 100 is an integrated circuit package that contains one light emitting diode 101 and two light detecting diodes 102 and 103 which are both illuminated by diode 101. Detecting diode 102 receives feedback signals from emitting diode 101 and detecting diode 103, which is included in an output circuit 50 electrically ground isolated from amplifying circuit 20, receives the feed forward signal from light emitting diode 101 which is reproduced as a representative signal at output lead 51.

The current shunt amplifier arrangement of the figure utilizes the dual detector opto-isolator to provide electrical ground isolation between the input signal and the output signal. As described above the opto-isolator comprises a light emitting diode 101 illuminating two isolated and substantially identical photo detecting diodes 102 and 103 differing only in their individual contrast ratios within a unit and by current transfer and contrast ratios from unit to unit. It is desirable that the differences in the gain or current transfer ratio from the emitting diode 101 to each of the detecting diodes 102 and 103 be compensated for and remain stable over long time intervals. The signal characteristics and signal inputs and gain of the operational amplifier 20 comprising the current shunt amplifier arrangement is adjusted to compensate for current transfer losses in the opto-isolator 100 which normally approximate a current transfer ratio of 100:1 from emitter to detector and also to secure the required current transfer ratio consistency. The current voltage characteristic of the opto-isolator must also be independent of temperature. Since the resistance of detector diodes vary with temperature, it is essential that the gain of the system be insensitive to these diode changes. Overall amplifier gain is controlled by the use of an emitting diode to detecting diode feedback circuit in the amplifier arrangement.

The calibration process to properly set the gain of amplifier 20 may be best understood by describing the process with respect to the electrical circuit characteristics and parameter of the overall amplifier arrangement. The input voltage $V_1$ to the inverting input of amplifier 20 is determined by the equation $$V_1 = V_{in} + i_{d2}(R_{17} + R_{27}) \quad (1)$$

where $V_{in}$ is the voltage on lead 16 at output of amplifier 15; $R_{17}$ and $R_{27}$ is the resistance of potentiometer 17 and resistor 27 respectively and $i_{d2}$ is the current in detecting diode 102. Since $i_{d2}$ is a feedback current response to the light emitting diode 101, $$i_{d2} = i_{d1} A_1 \quad (2)$$

where $i_{d1}$ is the current in light emitting diode 101 and $A_1$ is the current transfer ratio from light emitting diode 101 to light detecting diode 102, $i_{d2}$ may also be expressed as $$i_{d2} = \frac{V_0 - V_{d1} - V_{22}}{R_{31}} A_1 \quad (3)$$

where $V_0$ is the voltage on lead 21 relative to ground, $V_{d1}$ is the voltage drop across diode 101 and $V_{22}$ is the supply voltage at terminal 22. The voltage $V_2$ at the noninverting input of amplifier 20 is equal to $V_1$ and given by the equation $$V_2 = V_{in} + V_0 A_1 \frac{R_{17} + R_{27}}{R_{31}} - V_{d1} A_1 \frac{R_{17} + R_{27}}{R_{31}} - V_{22} A_1 \frac{R_{17} + R_{27}}{R_{31}}. \quad (4)$$

The amplifier output voltage $V_0$ on lead 21 is defined by the equation $$V_0 = \frac{R_{31}}{(R_{27} + R_{17})A_1}(V_2 - V_{in}) + v_{d1} + V_{22}. \quad (5)$$

The voltage $V_3$ at the inverting input of amplifier 55 is given by $$V_3 = V_{out} \frac{R_{32}}{R_{32} + R_{33}} + i_{d3} \frac{R_{32} R_{33}}{R_{32} + R_{33}} \quad (6)$$

where $V_{out}$ is the voltage on lead 51, $i_{d3}$ is the reverse current in detecting diode 103 and $R_{32}$ and $R_{33}$ as the impedance of resistances 32 and 33 respectively. The voltage $V_4$ at the noninverting input of amplifier 55 is given by the equation $$V_4 = V_{out} \frac{R_{32}}{R_{32} + R_{33}} + i_{d3} A_2 \frac{R_{32} R_{33}}{R_{32} + R_{33}} \quad (7)$$

where $A_2$ is the current transfer ratio between light emitting diode 101 and detecting diode 103.

Therefore, the relation between the value $V_{out}$ on lead 51 and the amplified shunt voltage $V_{in}$ is given by $$V_{out} = V_4 \frac{R_{32} + R_{33}}{R_{32}} -$$

$$V_2 \frac{R_{33}}{(R_{17} + R_{27})} \frac{A_2}{A_1} + V_{in} \frac{R_{33}}{(R_{17} + R_{27})} \frac{A_2}{A_1}. \quad (8)$$

This equation clearly points out the dependency of the output voltage $V_{out}$ on the contrast ratio $A_2/A_1$.

The above enumerated equation contains more unknowns than can be solved by direct solutions of the equations. However, the calibration procedure in accordance with the principles of the invention, utilizes the equations in a step by step process to eliminate the dependency of the output voltage $V_{out}$ on the contrast ratio. First the two leads 61 and 62 across shunt 11 are shorted by a lead 60 so the voltage input across the differential input leads to amplifier 15 is zero hence the voltage on lead 16 is zero. With the voltage $V_{in}$ equal to zero, the voltage $V_2$ at the input to the noninverting input of operational amplifier 20 on lead 23 is adjusted by adjusting potentiometer 29, as measured by voltage detector 28, to a value determined by the equation $$V_2 = \frac{R_{32} + R_{33}}{2R_{32}} V_4 - 1 \quad (9)$$

where $V_4$ is the present voltage measured at the noninverting input to operational amplifier 55.

This equation has been derived from the above equations by (1) setting the input voltage $V_{in}$ equal to zero, (2) setting the output voltage $V_{out}$ to a predetermined desired value (i.e., for the illustrative embodiment $V_{out} = 2$ volts) and by then (3) solving for $V_2$ in terms of $V_4$ and the resistor components $R_{32}$ and $R_{33}$. The potentiometer 17, as monitored by voltage detector 18, is then adjusted until the voltage $V_{out}$ at the output of operational amplifier 55 with respect to ground equals exactly the predetermined voltage (i.e., two volts).

The above described calibration technique properly sets the gain of the amplification system to compensate for variations that exist in the current transfer ratio and DC contrast from one opto-isolator to another and the DC contrast within the opto-isolator. The sequence of the calibration technique to attain the correct amplification gain permits a precise consistent setting of these values even though the number of unknowns indicated by classical analysis defeats the attempt to accomplish the same by solution of the equations.

What is claimed is:

1. In an amplifier circuit arrangement having at least an input amplifier, an output amplifier each having inverting and noninverting inputs and a dual detector opto-isolator including a light-emitting diode and first and second light detecting diodes and providing ground isolation between the input and output amplifier, the input amplifier circuit having an amplification gain operative for compensating for different current transfer and contrast ratios in the opto-isolator, calibration to set the amplification gain comprising the steps of (1) setting a voltage at an inverting input of the input amplifier to a zero value,
(2) measuring a voltage at the noninverting input of the output amplifier,
(3) adjusting a voltage at the noninverting input of the input amplifier according to the relation $$V_2 = KV_4 - 1$$

where K is one half an inverse of a ratio of an output voltage of the output amplifier to a voltage at its inverting input, and $V_2$ is a voltage at a noninverting input of the input amplifier, and $V_4$ is a voltage at a noninverting input of the output amplifier, and (4) adjusting the voltage at the inverting input of the input amplifier until an output voltage of the output amplifier equals a preselected fixed value.

2. In an amplifier circuit arrangement as defined in claim 1 wherein the step of adjusting the voltage at the inverting input utilizes an arrangement further comprises a sensing amplifier including differential inputs coupled to sense voltage across a current carrying shunt, and the input amplifier has an inverting input coupled through a potentiometer to an output of the sensing amplifier, whereby the potentiometer is utilized to adjust a voltage at the inverting input of the input amplifier to attain a voltage value at an output of the output amplifier during calibration.

3. In an amplifier circuit arrangement as defined in claim 2 wherein the step of adjusting the voltage at the noninverting input utilizes a second potentiometer for adjusting a voltage at the noninverting input of the input amplifier.

4. An amplifier circuit arrangement as defined in claim 3 further including a step of defining a value K wherein the output amplifier includes a feedback impedance and a shunt impedance coupled to an inverting input whose impedances determine the value K.

5. An amplification arrangement for sensing a voltage at an input and providing a proportionate voltage thereof at an output, the input and output being ground isolated by an opto-isolator having one light emitting diode and two light detecting diodes, a first light detecting diode coupled to the output and a second light detection diode providing feedback for linearizing a gain of the opto-isolator over a temperature range, the amplification arrangement having a amplification gain value calibrated to compensate for difference in gain between the light emitting diode and the first and second light detecting diode, the amplification gain being calibrated by the steps of (1) determining a first voltage at an output location sharing electrical ground with the output when the voltage at an input is zero,
(2) adjusting a second voltage at an input location sharing electrical ground with the input in accord with an algebraic relation dependent upon the first voltage, and
(3) adjusting a third voltage at an input location to achieve a predetermined voltage at the output.

6. An amplification arrangement as defined in claim 5 wherein the input location includes a first amplifier having an inverting and a noninverting input, a first potentiometer coupling an input voltage to the inverting input and a second potentiometer coupling the noninverting input to reference ground, and the step of adjusting a second voltage at an input location by an adjustment of the second potentiometer to achieve a voltage in accord with the algebraic relation.

7. An amplification arrangement as defined in claim 6 wherein the step of adjusting a third voltage involves utilizing the first potentiometer to adjust a voltage at the inverting input to achieve a desired output voltage.

8. An amplification arrangement as defined in claim 7 further including a second amplifier responsive to the second light detecting diode and wherein the algebraic relation is expressed by $V_2 = KV_4 - 1$, and $V_2$ is a voltage at a noninverting input of the first amplifier, $V_4$ is a voltage of a noninverting input of the second amplifier, and K is one half an inverse of a ratio of an output voltage of the second amplifier to a voltage at its inverting input.

* * * * *